United States Patent
Oh et al.

(10) Patent No.: US 11,015,562 B1
(45) Date of Patent: May 25, 2021

(54) VEHICLE AND METHOD OF CONTROLLING THE SAME

(71) Applicants: HYUNDAI MOTOR COMPANY, Seoul (KR); KIA MOTORS CORPORATION, Seoul (KR)

(72) Inventors: Hong Min Oh, Yongin-si (KR); Sung Jin Park, Seoul (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 0 days.

(21) Appl. No.: 17/105,018

(22) Filed: Nov. 25, 2020

(30) Foreign Application Priority Data

Jul. 16, 2020 (KR) .................. 10-2020-0087920

(51) Int. Cl.
*F02N 11/08* (2006.01)

(52) U.S. Cl.
CPC ...... *F02N 11/0818* (2013.01); *F02N 11/0862* (2013.01); *F02N 2200/063* (2013.01)

(58) Field of Classification Search
CPC ........... F02N 11/0862; F02N 2200/063; F02N 11/0818; F02N 11/0814
See application file for complete search history.

(56) References Cited

U.S. PATENT DOCUMENTS

| | | | |
|---|---|---|---|
| 9,434,385 B2 * | 9/2016 | Miyashita | F02N 11/0862 |
| 10,892,627 B2 * | 1/2021 | Oh | H02J 7/0029 |
| 2010/0269776 A1 * | 10/2010 | Mizuno | F02N 11/0825 |
| | | | 123/179.4 |
| 2016/0046292 A1 | 2/2016 | Miyashita | |

FOREIGN PATENT DOCUMENTS

| | | |
|---|---|---|
| JP | 2010221828 A | 10/2010 |
| JP | 4652627 B2 | 3/2011 |
| KR | 20140123838 | 10/2014 |
| KR | 20160067551 A | 6/2016 |
| KR | 20170052936 A | 5/2017 |
| KR | 20190110190 A | 9/2019 |

* cited by examiner

*Primary Examiner* — Xiao En Mo
(74) *Attorney, Agent, or Firm* — Lempia Summerfield Katz LLC

(57) ABSTRACT

A vehicle and a method use an Idle Stop and Go (ISG) system. The vehicle includes: a battery; a battery sensor configured to measure a lowest voltage of the battery at a time of startup of the vehicle; a driving unit including an engine of the vehicle; and a controller. The controller is configured to: compare a first lowest voltage predicted using a current lowest voltage of the battery with a reference value to determine whether the lowest voltage of the battery has been changed; in response to determining the lowest voltage of the battery has been changed, calculate a difference between the current lowest voltage of the battery and an immediately previous lowest voltage of the battery; calculate an accumulated current between a current of the battery at the immediately previous time point and a current of the battery at the current time point; calculate a correction voltage for the accumulated current; predict a second lowest voltage using at least one of the difference between the current lowest voltage of the battery and the immediately previous lowest voltage of the battery or the correction voltage; compare the second lowest voltage with a second determination value; and control the driving unit to control entry into a stop of the ISG system according to a result of the comparison.

20 Claims, 8 Drawing Sheets

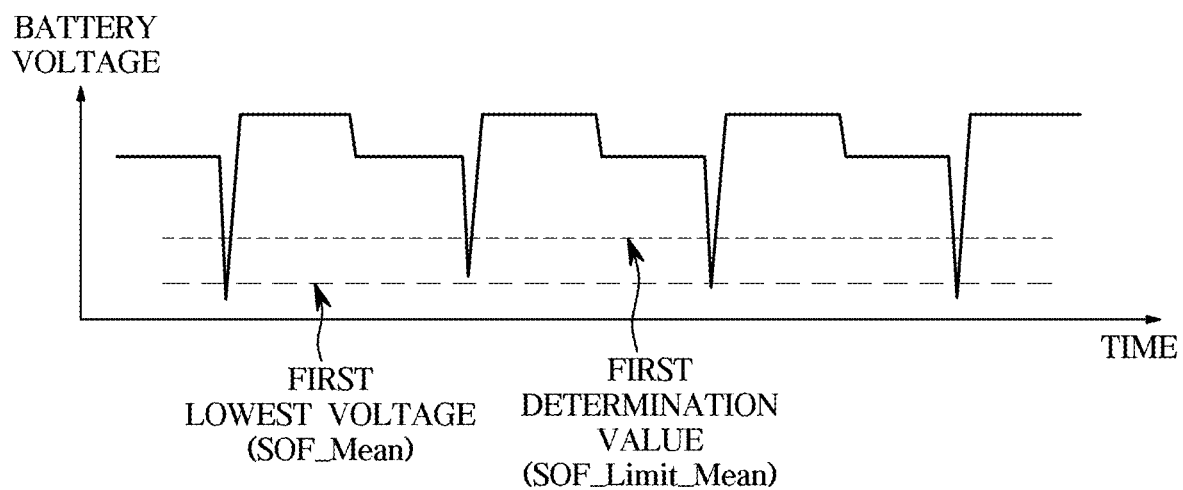

FIG.5c

| V(Q$_{AB}$) CORRECTION VOLTAGE | | Q$_{AB}$ ACCUMULATED CURRENT | | |
|---|---|---|---|---|
| | | −1 Ah | 0 Ah | 1 Ah |
| V$_{AB}$ VOLTAGE | 0.3 | 0.1 | 0.15 | 0.2 |
| | 0.2 | 0.05 | 0.1 | 0.15 |
| | 0.1 | 0 | 0.05 | 0.1 |

VEHICLE AND METHOD OF CONTROLLING THE SAME

CROSS-REFERENCE TO RELATED APPLICATION

This application is based on and claims priority under 35 U.S.C. § 119 to Korean Patent Application No. 10-2020-0087920, filed on Jul. 16, 2020 in the Korean Intellectual Property Office, the disclosure of which is incorporated herein by reference.

BACKGROUND

1. Field

The disclosure relates to a vehicle and a method of controlling the same.

2. Description of the Related Art

Recently, as the importance of fuel efficiency has been emphasized, a system for improving fuel efficiency is being applied to a vehicle. In particular, an Idle Stop and Go (ISG) system is widely used as a technology for improving fuel economy. However, since the ISG system switches off the ignition of an engine, an alternator does not generate electricity, and electric energy required for the vehicle is obtained from a battery, so that the State of Charge (SOC) of the battery decreases. In addition, in order to ensure a restart performance after ignition-off, the vehicle may also use a logic that predicts the state of the battery and prevents the vehicle from being set into an ignition-off state during a stop of the vehicle.

A normal operation of the ISG system is determined by the state of the battery in addition to the state of the vehicle. The state of the battery is generally determined by the SOC of the battery, the liquid temperature of the battery, and the lowest voltage prediction algorithm, i.e., State of Function (SOF) at a time of startup. As the SOC of the battery is lower and the battery liquid temperature is lower, the battery performance is degraded, which imposes restrictions on the use of the battery. However, as the battery ages, the battery performance is not easily determined only with the SOC and the liquid temperature of the battery. Thus, the lowest voltage prediction algorithm (SOF) is used to more accurately predict the state of the battery state at a time of startup.

However, the existing algorithm of predicting the lowest voltage at startup has a limitation in predicting the lowest voltage according to a pattern in which the battery ages. Accordingly, the present disclosure proposes an algorithm (SOF) of predicting the lowest battery voltage at a time of start up during estimation of a battery state for operation of an ISG system.

SUMMARY

Therefore, it is an object of the disclosure to provide a vehicle capable of predicting the lowest voltage of a battery with a higher accuracy using a voltage change history and an accumulated current of the battery. It is another object of the disclosure to provide a method of controlling the same.

Additional aspects of the disclosure are set forth in part in the description which follows and, in part, should be apparent from the description, or may be learned by practice of the disclosure.

It is an aspect of the disclosure to provide a vehicle using an Idle Stop and Go (ISG) system. The vehicle includes: a battery; a battery sensor configured to measure a lowest voltage of the battery at a time of startup of the vehicle; a driving unit including an engine of the vehicle; and a controller configured to compare a first lowest voltage predicted using a current lowest voltage of the battery with a reference value to determine whether the lowest voltage of the battery has been changed. The controller is configured to, in response to determining the lowest voltage of the battery has been changed: calculate a difference between the current lowest voltage of the battery and an immediately previous lowest voltage of the battery; calculate an accumulated current between a current of the battery at the immediately previous time point and a current of the battery at the current time point; calculate a correction voltage for the accumulated current; predict a second lowest voltage using at least one of the difference between the current lowest voltage of the battery and the immediately previous lowest voltage of the battery or the correction voltage; compare the second lowest voltage with a second determination value; and control the driving unit to control entry into a stop of the ISG system according to a result of the comparison.

The vehicle may further include a storage configured to store the current lowest voltage of the battery and the immediately previous lowest voltage.

The controller may determine that the lowest voltage of the battery has been changed when a value of the first lowest voltage minus the current lowest voltage of the battery is larger than the reference value.

The controller may control the driving unit to allow entry into a stop of the ISG system when a value of the first lowest voltage minus the current lowest voltage is smaller than the reference value.

The controller may predict the second lowest voltage using a value of the current lowest voltage of the battery minus the difference between the current lowest voltage and the immediately previous lowest voltage and the correction voltage.

The controller may control the driving unit to prevent entry into a stop of the ISG system when the first lowest voltage is smaller than a first determination value.

The controller may determine whether the lowest voltage of the battery has been changed when the first lowest voltage is larger than a first determination value.

The controller may control the driving unit to allow entry into a stop of the ISG system when the second lowest voltage is larger than the second determination value.

The controller may control the driving unit to prevent entry into a stop of the ISG system when the second lowest voltage is smaller than the second determination value.

The controller may perform moving average processing on the current lowest voltage of the battery to predict the first lowest voltage.

It is another aspect of the disclosure to provide a method of controlling a vehicle using an ISG system. The method includes: comparing a first lowest voltage predicted using a current lowest voltage of a battery with a reference value to determine whether a lowest voltage of the battery has been changed; in response to determining the lowest voltage of the battery has been changed, calculating a difference between the current lowest voltage of the battery and an immediately previous lowest voltage of the battery; calculating an accumulated current between a current of the battery at the immediately previous time point and a current of the battery at the current time point; calculating a correction voltage for the accumulated current; predicting a second lowest voltage using at least one of the difference between the current lowest voltage of the battery and the immediately previous lowest voltage of the battery or the correction voltage; and comparing the second lowest voltage with a second determination value and controlling entry into a stop of the ISG system according to a result of the comparison.

The method may further include storing the current lowest voltage of the battery and the immediately previous lowest voltage.

The method may further include determining that the lowest voltage of the battery has been changed when a value of the first lowest voltage minus the current lowest voltage of the battery is larger than the reference value.

The method may further include allowing entry into a stop of the ISG system when a value of the first lowest voltage minus the current lowest voltage is smaller than the reference value.

The method may further include predicting the second lowest voltage using a value of the current lowest voltage of the battery minus the difference between the current lowest voltage and the immediately previous lowest voltage and the correction voltage.

The method may further include preventing entry into a stop of the ISG system when the first lowest voltage is smaller than a first determination value.

The method may further include determining whether the lowest voltage of the battery has been changed when the first lowest voltage is larger than a first determination value.

The method may further include allowing entry into a stop of the ISG system when the second lowest voltage is larger than the second determination value.

The method may further include preventing entry into a stop of the ISG system when the second lowest voltage is smaller than the second determination value.

The method may further include performing moving average processing on the current lowest voltage of the battery to predict the first lowest voltage.

BRIEF DESCRIPTION OF THE DRAWINGS

These and/or other aspects of the disclosure will become apparent and more readily appreciated from the following description of the embodiments, taken in conjunction with the accompanying drawings of which:

FIGS. 5a and 5b are graphs showing a vehicle battery voltage according to an embodiment of the present disclosure; and FIG. 5c is a table showing voltage correction values according to an embodiment of the present disclosure.

DETAILED DESCRIPTION

Figure 1:
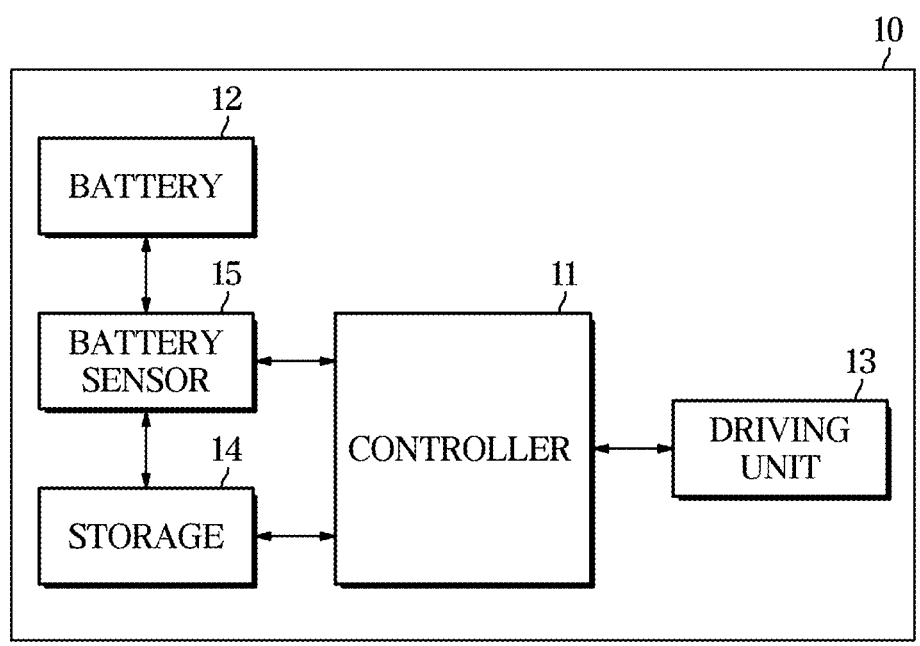
FIG. 1 is a control block diagram illustrating a vehicle according to an embodiment of the present disclosure.

Like numerals refer to like elements throughout the specification. Not all elements of embodiments of the present disclosure have been described, and description of aspects that are commonly known in the art or that overlap each other in the embodiments have been omitted. The terms as used throughout the specification, such as "~part", "~module", "~member", "~block", etc., may be implemented in software and/or hardware, and a plurality of "~parts", "~modules", "~members", or "~blocks" may be implemented in a single element, or a single "~part", "~module", "~member", or "~block" may include a plurality of elements.

It should be further understood that the term "connect" or its derivatives refer both to direct and indirect connection, and the indirect connection includes a connection over a wireless communication network.

It should be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

In the description of an embodiment, it should be understood that, when a member is referred to as being "on/under" another member, it can be directly on/under the other member, or one or more intervening members may also be present.

Although the terms "first," "second," "A," "B," and the like may be used to describe various components, the terms do not limit the corresponding components. Such terms are used only for the purpose of distinguishing one component from another component.

As used herein, the singular forms "a," "an" and "the" are intended to include the plural forms as well, unless the context clearly indicates otherwise.

Reference numerals used for method steps are just used for convenience of explanation, but not to limit an order of the steps. Thus, unless the context clearly dictates otherwise, the written order may be practiced otherwise.

Hereinafter, the principles and embodiments of the disclosure are described with reference to the accompanying drawings.

A vehicle 10 according to an embodiment of the present disclosure may be a vehicle using an Idle Stop and Go (ISG) system.

FIG. 1 is a control block diagram illustrating the vehicle 10 according to the embodiment of the present disclosure.

Referring to FIG. 1, the vehicle 10 includes a battery 12, a driving unit 13 including an engine of the vehicle 10, a storage 14 configured to store a current lowest voltage of the battery 12 and an immediately previous lowest voltage of the battery 12, a battery sensor 15 configured to measure the lowest voltage of the battery 12 at a time of startup, and a controller 11. The controller 11 is configured to compare a first lowest voltage predicted using the current lowest voltage of the battery 12 with a reference value to determine whether the lowest voltage of the battery 12 has been changed. and the controller 11 is also configured to, in response to determining the lowest voltage of the battery 12 has been changed, calculate a difference between the current lowest voltage of the battery 12 and the immediately previous lowest voltage of the battery 12. The controller 11 is also configured to calculate a correction voltage for an accumulated current between a current of the battery 12 at an immediately previous time point and a current of the battery 12 at a current time point. The controller 11 is further configured to predict a second lowest voltage using at least one of the difference between the current lowest voltage of the battery and the immediately previous lowest voltage of the battery 12 or the correction voltage. The controller 11 is configured to compare the second lowest voltage with a second determination value and to control entry into a stop mode or idle stop, i.e., a stop of the ISG system according to a result of the comparison.

The battery 12 may perform charging and discharging of power, may be charged based on the rotational force of the engine, and may supply power to various electronic devices provided in the vehicle 10.

The battery sensor 15 may be an intelligent battery sensor (IBS), and measure the voltage, current, and temperature of the battery 12 to measure the magnitude of power supplied from the battery 12 and the amount of charge of the battery 12.

The battery sensor 15 may be provided at a terminal of the battery 12 to measure input power or output power. To this end, the battery sensor 15 may include a current sensor, a voltage sensor, and the like.

The storage 14 may store various types of information required for control of the vehicle 10. The storage 14 may store the lowest voltage of the battery 12 measured by the battery sensor 15, the current of the battery 12 measured by the battery sensor 15, a first determination value, a second determination value, and a reference value.

To this end, the storage 14 may be implemented using a nonvolatile memory device, such as a cache, a read only memory (ROM), a programmable ROM (PROM), an erasable programmable ROM (EPROM), an electrically erasable programmable ROM (EEPROM), and a flash memory. The storage 14 may be implemented using a volatile memory device, such as a random access memory (RAM), or other storage media, such as a hard disk drive (HDD), a CD-ROM, and the like. The implementation of the storage 14 is not limited thereto.

The driving unit 13 may be provided as a device capable of driving a vehicle.

In more detail, the driving unit 13 may include an engine (not shown) and may include various components (also not shown) for driving the engine.

The controller 11 may perform a moving average process on the current lowest voltage of the battery 12 to predict the first lowest voltage.

In this case, the reason for the moving average process being performed on the current lowest voltage of the battery 12 may be to determine a change of a state of the battery 12, which is a factor that affects the lowest voltage at a time of startup of the vehicle 10. The reason may also be to minimize an error occurring within a time period for maintaining the lowest voltage of the battery 12.

Here, the controller 11 may calculate an accumulated current between the current of the battery 12 at an immediately previous time point and the current of the battery 12 at a current time point.

The controller 11 may compare the first lowest voltage with the first determination value. When the first lowest voltage is smaller than the first determination value, the controller 11 may control the driving unit to prevent entry into a stop mode or idle stop, i.e., a stop of the ISG. Here, the first determination value may be a predetermined value to determine whether to enter a stop of the ISG system.

When the first lowest voltage is larger than the first determination value, the controller 11 may compare the first lowest voltage with the reference value to determine whether the lowest voltage of the battery 12 has rapidly changed.

In more detail, the controller 11 may compare a value obtained by subtracting the current lowest voltage from the first lowest voltage with the reference value.

When the value obtained by subtracting the current lowest voltage from the first lowest voltage is larger than the reference value, the controller 11 may determine that the lowest voltage of the battery 12 has rapidly changed.

In this case, the reference value is a criterion value for determining whether an error may occur due to the amount of change in lowest voltage at a time of startup of the vehicle 10. The reference value may be determined in advance.

When the value obtained by subtracting the current lowest voltage from the first lowest voltage is smaller than the reference value, the controller 11 may determine that the lowest voltage of the battery 12 has not changed rapidly.

In this case, the controller 11 may control the driving unit to enter a stop of the ISG system.

When it is determined that the lowest voltage of the battery 12 has rapidly changed, the controller 11 may calculate a difference between the current lowest voltage of the battery 12 and the immediately previous lowest voltage of the battery 12.

Here, the immediately previous lowest voltage of the battery 12 may be the lowest voltage measured at a time of startup of the vehicle 10 immediately before the current lowest voltage of the battery 12 is measured.

The controller 11 may calculate the accumulated current of the battery 12.

Here, the accumulated current may be a current accumulated between the current of the battery 12 at an immediately previous time point and the current of the battery 12 at a current time point. In this case, the current of the battery 12 at the immediately previous time point is a current measured at a time of startup of the vehicle 10 immediately before the current of the battery 12 at the current time point is measured. For example, one may assume that the time point at which the current of the battery 12 at the immediately previous time point is measured is denoted as A and may assume that the time point at which the current of the battery 12 at the current time point is measured is denoted as B. When the time interval between the time points A and B is 10 minutes, and a current of 6 A (ampere) flows between the time point A and the time point B, the accumulated current may be calculated as 10 min/60 min*6 A (ampere)=1 A/h.

The controller 11 may calculate a correction voltage for the accumulated current of the battery 12.

The controller 11 may predict the second lowest voltage using the calculated difference between the current lowest voltage of the battery 12 and the immediately previous lowest voltage of the battery 12 and the calculated correction voltage.

In more detail, the controller 11 may predict the second lowest voltage using a value of the current lowest voltage of the battery 12 minus the difference between the current lowest voltage of the battery 12 and the immediately previous lowest voltage of the battery 12 and the correction voltage.

The controller 11 may compare the predicted second lowest voltage with the second determination value.

The controller 11 may control the driving unit to prevent entry into a stop of the ISG system when the second lowest voltage is smaller than the second determination value.

The controller 11 may control the driving unit to allow entry into a stop of the ISG system when the second lowest voltage is larger than the second determination value.

Here, the second determination value may be a predetermined value to determine whether to enter a stop of the ISG system.

Figure 2A:
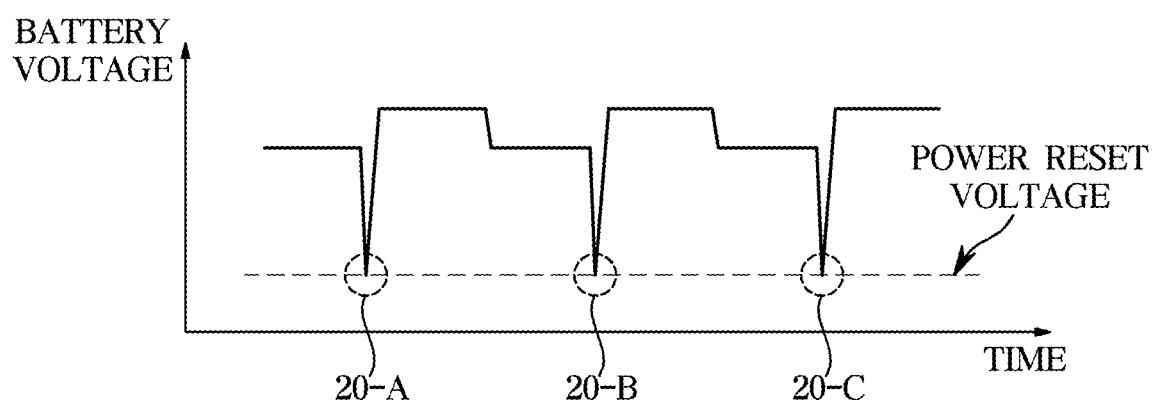
FIGS. 2a and 2b are graphs showing a battery voltage of a vehicle according to the conventional technology.
Figure 2B:
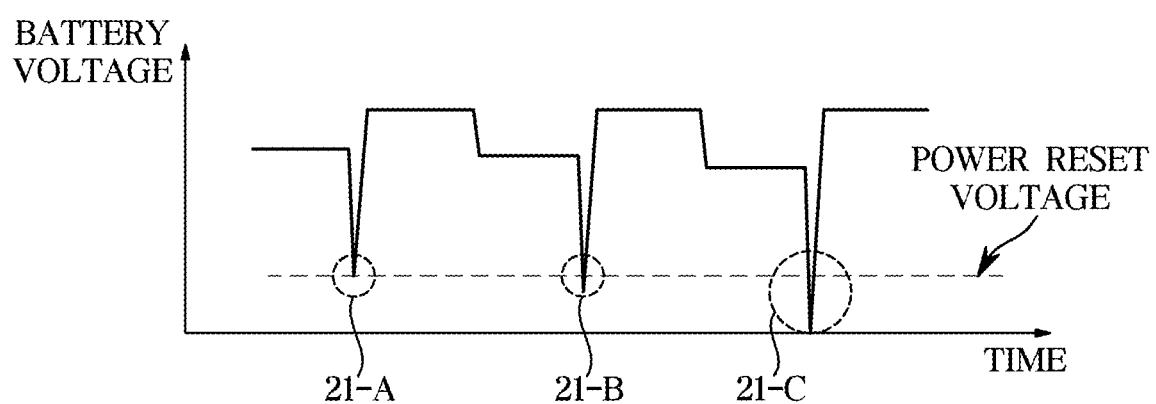

FIGS. 2a and 2b are graphs showing a battery voltage of a vehicle according to the conventional technology.

FIG. 2a shows a graph of the battery voltage over time when the battery 12 has not significantly aged, i.e., is relatively new or newer.

In more detail, since the battery 12 is in a state of not being aged in a great scale, the available capacity of the battery 12 may be large. In this case, the battery 12 having a large available capacity may not have an internal resistance that is greatly increased even when the engine is repeatedly turned on/off.

Referring to FIG. 2a, when the engine is turned on/off at a time point 20-A, the lowest voltage of the battery 12 may not drop below the power reset voltage.

When the engine is turned on/off at a time point 20-B, the lowest voltage of the battery 12 may not drop below the power reset voltage. When the engine is turned on/off at a time point 20-C, the lowest voltage of the battery 12 may not drop below the power reset voltage.

As described above, when the engine is turned on/off in a state of the battery 12 not being aged in a great scale and thus having a large available capacity, the lowest voltage of the battery 12 does not drop below the power reset voltage. Accordingly, even when entry into a start of the ISG system is not prevented, main parts of the vehicle 10 may not go through power reset.

FIG. 2b shows a graph of the battery voltage over time when the battery 12 has aged in a great scale.

In more detail, since the battery 12 has undergone a lot of aging, i.e., is relatively old or older, the available capacity of the battery 12 may be small.

In this case, the battery 12 having a small available capacity may have an internal resistance that is largely increased as the engine is repeatedly turned on/off.

Referring to FIG. 2b, when the engine is turned on/off at a time point 21-A, the lowest voltage of the battery 12 may not drop below the power reset voltage.

When the engine is turned on/off at a time point 21-B, the lowest voltage of the battery 12 may drop below the power reset voltage. When the engine of the vehicle 10 is turned on/off at a time point 21-C, the lowest voltage of the battery 12 may rapidly drop below the power reset voltage.

As described above, when the engine is turned on/off in a state of the battery 12 being significantly aged and thus having a small available capacity, the lowest voltage of the battery 12 may rapidly drop below the power reset voltage. Accordingly, when the entry into a stop of the ISG system is not prevented, power reset may occur in the main parts of the vehicle 1.

This may be because, when the available capacity of the battery 12 is small, a chemical reaction area with respect to the available energy around an inner electrode plate of the battery 12 is rapidly reduced due to repeated startups. In other words, the battery 12 is a chemical product, and a chemical reaction requires an actual physical movement of a reactant (e.g., an active material, an electrolyte, and the like).

Referring to FIG. 2a, when the available capacity of the battery 12 is large, reactants capable of supplying energy remain around the inner electrode plate of the battery 12 even after repeated startups, so that the internal resistance does not greatly increase. Referring to FIG. 2b, when the available capacity of the battery 12 is small, repeated startups cause reactants around the electrode plate to be rapidly exhausted, so that the internal resistance of the battery 12 is greatly increased, and the lowest voltage may rapidly drop.

Figure 3:
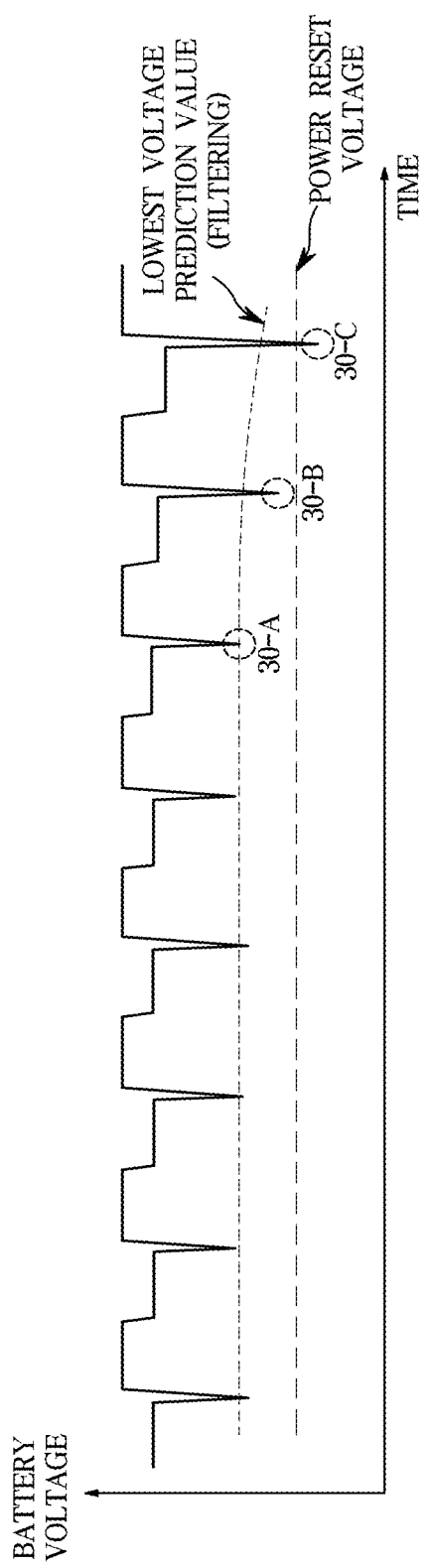
FIG. 3 is a graph showing a battery voltage of a vehicle according to an embodiment of the present disclosure.

FIG. 3 is a graph showing a battery voltage of a vehicle according to an embodiment of the present disclosure.

In FIG. 3, a graph of the battery voltage over time according to the embodiment of the present disclosure when the battery 12 has aged in a great scale and thus has a small available capacity is shown.

Referring to FIG. 3, the lowest voltage when the engine is turned on/off at a time point 30-A may be similar to the lowest voltage when the engine is turned on/off at a time point prior to the time point 30-A. In addition, the lowest voltage when the engine is turned on/off at the time point 30-A may be similar to a first lowest voltage.

Here, the first lowest voltage may be predicted by performing a moving average process using the current lowest voltage of the battery 12.

Since the available capacity of the battery 12 at a time point 30-B decreases compared to that of the time point 30-A, the lowest voltage of the battery 12 when the engine is turned on/off at the time 30-B may be lower than the lowest voltage of the battery 12 when the engine is turned on/off at the time point 30-A. In addition, the lowest voltage of the battery 12 when the engine is turned on/off at the time point 30-B may drop below the first lowest voltage.

Here, as shown in FIG. 3, the first lowest voltage may decrease as progressing from the time point 30-A to the time point 30-B and then to the time point 30-C.

Since the available capacity of the battery 12 at the time point 30-C decreases compared to that at the time point 30-B, the lowest voltage when the engine is turned on/off at the time point 30-C may be lower than the lowest voltage when the engine is turned on/off at the time point 30-B. In addition, the lowest voltage when the engine is turned on/off at the time point 30-C may rapidly drop below the first lowest voltage predicted value.

In this case, as shown in FIG. 3, the lowest voltage when the engine is turned on/off at the time point 30-C may drop below the power reset voltage.

The following description provides a method of predicting the lowest voltage of the battery 12 with a higher accuracy when the current lowest voltage of the battery 12 at a time of turn on/off of the engine rapidly drops below the first lowest voltage that is predicted by performing a moving average processing on the lowest voltage of the battery 12.

Referring to FIG. 3, the vehicle 10 may measure the lowest voltage of the battery 12 when the engine is turned on/off at a time point 30-A.

The vehicle 10 may measure the lowest voltage of the battery 12 when the engine is turned on/off at a time point 30-B.

The vehicle 10, when the lowest voltage of the battery 12 currently measured at the time point 30-B is lower than a first lowest voltage of the battery 12 predicted by performing a moving average processing at the time point 30-B and is higher than a power reset voltage, may determine that the lowest voltage of the battery 12 has changed.

Here, the vehicle 10 may calculate a difference between the lowest voltage of the battery 12 at the time point 30-A and the lowest voltage of the battery 12 at the time point 30-B.

In this case, the vehicle 10 may calculate an accumulated current between the current of the battery 12 at the time point 30-A and the current of the battery 12 at the time point 30-B. In addition, the vehicle 10 may calculate a correction voltage of the battery 12 using the calculated accumulated current of the battery 12.

In order to predict a second lowest voltage at a time point 30-C, a difference between the current lowest voltage of the battery 12 currently measured at the time point 30-A and the lowest voltage of the battery 12 at the time point 30-B and the calculated correction voltage of the battery 12 is subtracted from the lowest voltage of the battery 12 measured at the time point 30-B, so that the second lowest voltage at the time point 30-C may be predicted.

Figure 4:
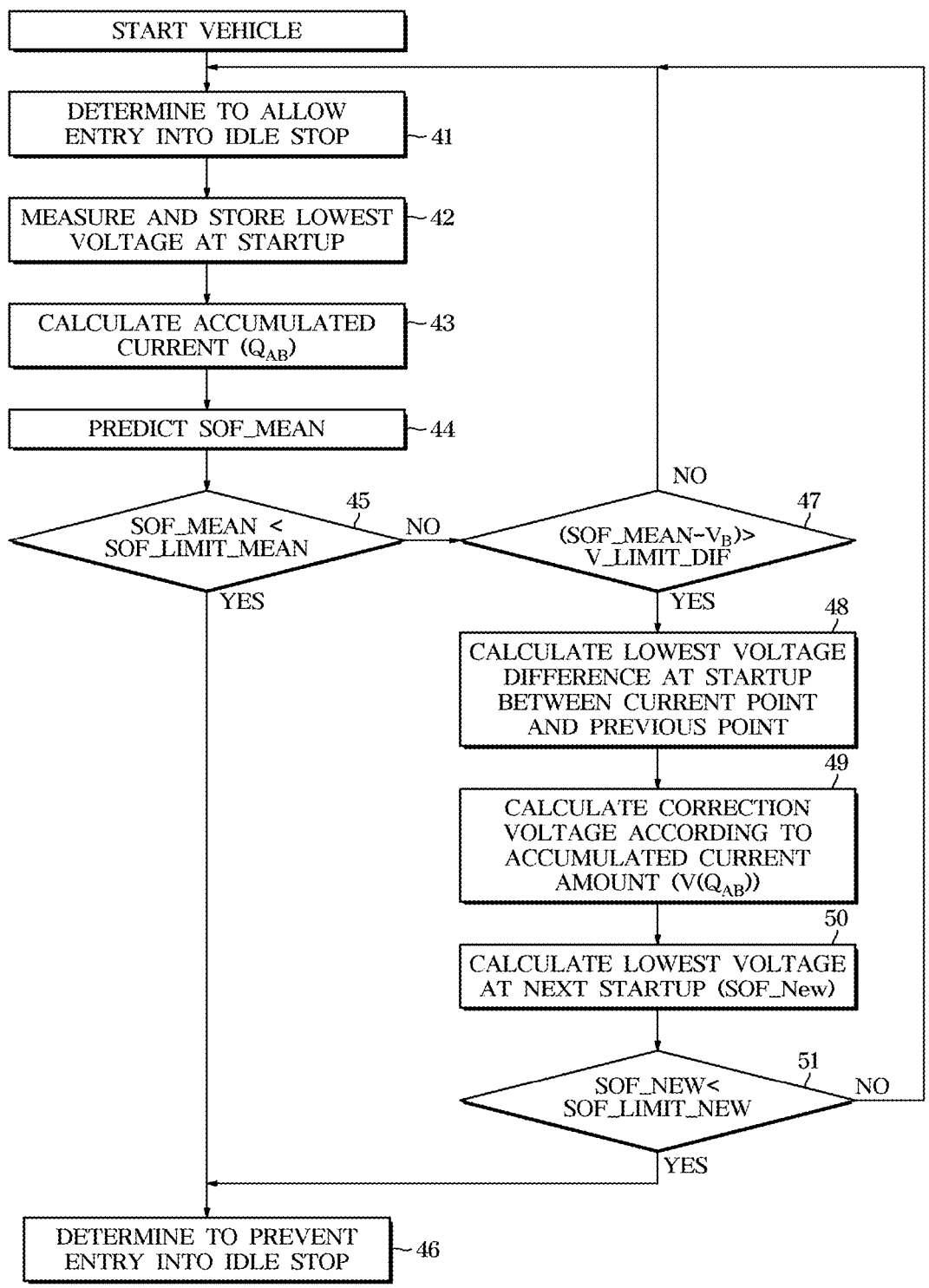
FIG. 4 is a flowchart showing a method of controlling a vehicle according to an embodiment of the present disclosure.

FIG. 4 is a flowchart showing a method of controlling a vehicle according to an embodiment of the present disclosure.

Hereinafter, a method of controlling the vehicle 10 for determining entry into stop of the ISG system will be described with reference to FIG. 4.

The vehicle 10 may perform an algorithm for determining entry into a stop mode or stop of the ISG system (41), i.e., an idle stop.

When the vehicle 10 starts, the vehicle 10 may measure the immediately previous lowest voltage of the battery 12 and the current lowest voltage of the battery 12 (42).

Here, the immediately previous lowest voltage of the battery 12 may be the lowest voltage measured at a time of startup of the vehicle 10 immediately before the current lowest voltage of the battery 12 is measured.

The vehicle 10 may calculate an accumulated current using a current of the battery 12 at the immediately previous time point and a current of the battery 12 at the current time point (43)

Here, the accumulated current may be a current accumulated between the current of the battery 12 at the immediately previous time point and the current of the battery 12 at the current time point. In this case, the current of the battery 12 at the immediately previous time point is a current measured at a time of startup of the vehicle 10 immediately before the current of the battery 12 at the current time point is measured. For example, one may assume that the time point at which the current of the battery 12 at the immediately previous time point is measured is denoted as A and may assume that the time point at which the current of the battery 12 at the current time point is measured is denoted as B. When the time interval between the time points A and B is 10 minutes, and a current of 6 A (ampere) flows between the time point A and the time point B, the accumulated current may be calculated as 10 min/60 min*6 A (ampere)=1 A/h.

The vehicle 10 may predict a first lowest voltage SOF_Mean by performing a moving average process using the current lowest voltage of the battery 12 (44)

The vehicle 10 may compare the first lowest voltage SOF_Mean with a first determination value SOF_Limit_Mean (45).

When the first lowest voltage SOF_Mean is smaller than the first determination value SOF_Limit_Mean, the vehicle 10 may prevent entry into a stop of the ISG system (46).

When the first lowest voltage SOF_Mean is not smaller that, i.e., is equal to or larger than the first determination value SOF_Limit_Mean, the vehicle 10 may compare a value of the first lowest voltage SOF_Mean minus the current lowest voltage of the battery 12 with a reference value V_Limit_Dif (47).

In this case, the reference value V_Limit_Dif is a criterion value for determining whether an error may occur due to the amount of change in lowest voltage when the vehicle 10 is started. The reference value V_Limit_Dif may be determined in advance.

When the value of the first lowest voltage SOF_Mean minus the current lowest voltage of the battery 12 ($V_B$) is smaller than or equal to the reference value V_Limit_Dif, the vehicle 10 may determine that the lowest voltage of the battery 12 has not changed, and may enter a stop of the ISG system.

When the value of the first lowest voltage SOF_Mean minus the current lowest voltage of the battery 12 ($V_B$) is larger than the reference value V_Limit_Dif, the vehicle 10 may determine that the lowest voltage of the battery 12 has rapidly changed.

Upon determining that the lowest voltage of the battery 12 has rapidly changed, the vehicle 10 may calculate a difference ($V_{Dif}$) between the current lowest voltage of the battery 12 and the immediately previous lowest voltage of the battery 12 (48).

The vehicle 10 may calculate an accumulated current between the current of the battery 12 at the immediately previous time point and the current of the battery 12 at the current time point.

The vehicle 10 may calculate a correction voltage $V(Q_{AB})$ of the battery 12 using the accumulated current of the battery 12 (49).

The vehicle 10 may predict a second lowest voltage SOF_New using a value obtained by subtracting the difference $V_{dif}$ and the correction voltage $V Q_{AB}$ from the current lowest voltage of the battery 12 (50).

The vehicle 10 may compare the second lowest voltage SOF_New with a second determination value SOF_Limit_New (51).

When the second lowest voltage SOF_New is smaller than the second determination value SOF_Limit_New, the vehicle 10 may prevent entry into a stop of the ISG system (46).

When the second lowest voltage SOF_New is equal to or larger than the second determination value SOF_Limit_New, the vehicle 10 may allow entry into a stop of the ISG system.

Here, the first determination value and the second determination value may be predetermined values to determine whether to enter a stop of the ISG system.

Figure 5B:
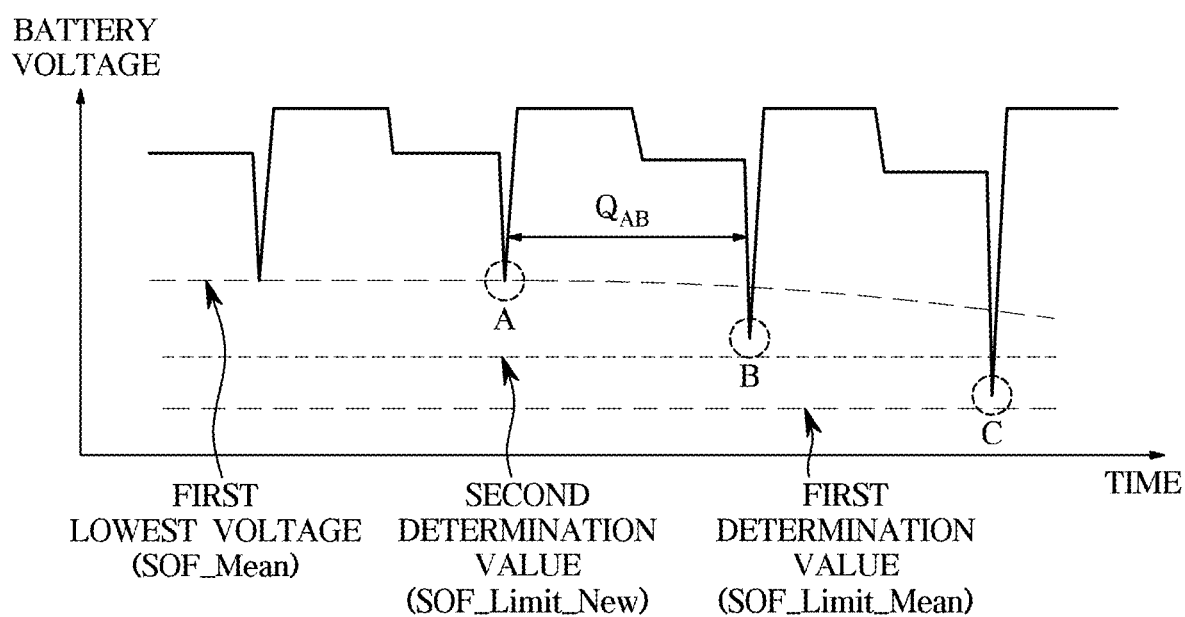

FIGS. 5a and 5b are graphs showing a vehicle battery voltage according to an embodiment of the present disclosure. FIG. 5c is a table showing voltage correction values according to an embodiment of the present disclosure.

Referring to FIG. 5a, for example, in a state in which the first determination value SOF_Limit_Mean is 7V (voltage), when the first lowest voltage SOF_Mean subjected to a moving average processing is 6V (voltage), the vehicle 10 may prevent entry into a stop of the ISG system because the first lowest voltage since SOF_Mean is smaller than the first determination value SOF_Limit_Mean.

Referring to FIG. 5b, for example, it may be assumed that the lowest voltage of the battery 12 when the engine is turned on/off at a time point A is 8.5V and the lowest voltage of the battery 12 when the engine is turned on/off at a time point B is 8.3. V. It may also be assumed that the accumulated current $Q_{AB}$ from a time point A to a time point B is 1 Ah, the first lowest voltage SOF_Mean is 8.5V, the second determination value SOF_Limit_New is 8V, the first determination value SOF_Limit_Mean is 7V, and the reference value is 0.1V.

In this case, since the first lowest voltage SOF_Mean of 8.5V is larger than the first determination value SOF_Limit_Mean of 7V, the vehicle 10 may determine whether a value of the first lowest voltage SOF_Mean of 8.5V minus the lowest voltage the battery 12 of 8.3V at a time point B is larger than the reference value of 0.1V.

When the value of the first lowest voltage SOF_Mean of 8.5V minus the lowest voltage of the battery 12 of 8.3V at a time point B is larger than the reference value of 0.1V, the vehicle 10 may determine that the lowest voltage of the battery 12 has rapidly changed.

Upon determining that the lowest voltage of the battery 12 has rapidly changed, the vehicle 10 may calculate the difference $V_{Dif}$ between the lowest voltage of 8.5V of the battery 12 at a time point A and the lowest voltage of 8.3V of the battery 12 at a time point B as 0.2V. In this case, the vehicle 10 may calculate the correction voltage $V(Q_{AB})$ of the accumulated current of the battery 12 as 0.15V based on the correction voltage table shown in FIG. 5c.

The vehicle 10 may subtract the lowest voltage difference $V_{Dif}$ (8.3V) of the battery 12 between lowest voltages of a time point A and a time point B and the correction voltage $V(Q_{AB})$ (0.15V) from the lowest voltage of 8.3V of the battery 12 at a time point B. The vehicle 10 may thereby calculate the second lowest voltage SOF_New at a time point C as 7.95V.

The vehicle 10 may predict the second lowest voltage SOF_New at a time point C as 7.95V, which is lower than the second determination value SOF_Limit_New, and thus prevent entry into a stop of the ISG system of the vehicle 10.

The disclosed embodiments may be embodied in the form of a recording medium storing instructions executable by a computer. The instructions may be stored in the form of program code and, when executed by a processor, may generate a program module to perform the operations of the disclosed embodiments. The recording medium may be embodied as a computer-readable recording medium.

The computer-readable recording medium includes all kinds of recording media in which instructions which may be decoded by a computer are stored, for example, a Read Only Memory (ROM), a Random Access Memory (RAM), a magnetic tape, a magnetic disk, a flash memory, an optical data storage device, and the like.

As is apparent from the above, even when the battery ages, the lowest voltage of the battery at a time of startup can be accurately predicted.

Since the lowest voltage of the battery at a time of startup is accurately predicted, ignition off of the vehicle can be prevented and the energy utilization of the battery can be enhanced.

Although specific embodiments of the present disclosure have been described for illustrative purposes, those having ordinary skill in the art should appreciate that various modifications, additions and substitutions are possible, without departing from the scope and spirit of the disclosure. Therefore, embodiments of the present disclosure have not been described for limiting purposes.

What is claimed is:

1. A vehicle using an Idle Stop and Go (ISG) system, the vehicle comprising:
   a battery;
   a battery sensor configured to measure a lowest voltage of the battery at a time of startup of the vehicle;
   a driving unit including an engine of the vehicle; and
   a controller configured to compare a first lowest voltage predicted using a current lowest voltage of the battery with a reference value to determine whether the lowest voltage of the battery has been changed,
   wherein, in response to determining that the lowest voltage of the battery has been changed, the controller is configured to calculate a difference between the current lowest voltage of the battery and an immediately previous lowest voltage of the battery, calculate an accumulated current between a current of the battery at the immediately previous time point and a current of the battery at the current time point, calculate a correction voltage for the accumulated current, predict a second lowest voltage using at least one of the difference between the current lowest voltage of the battery and the immediately previous lowest voltage of the battery or the correction voltage, compare the second lowest voltage with a second determination value, and control the driving unit to control entry into a stop of the ISG system according to a result of the comparison.

2. The vehicle of claim 1, further comprising a storage configured to store the current lowest voltage of the battery and the immediately previous lowest voltage.

3. The vehicle of claim 1, wherein the controller determines that the lowest voltage of the battery has been changed when a value of the first lowest voltage minus the current lowest voltage of the battery is larger than the reference value.

4. The vehicle of claim 1, wherein the controller controls the driving unit to allow entry into a stop of the ISG system when a value of the first lowest voltage minus the current lowest voltage is smaller than the reference value.

5. The vehicle of claim 1, wherein the controller predicts the second lowest voltage using a value of the current lowest voltage of the battery minus the difference between the current lowest voltage and the immediately previous lowest voltage and the correction voltage.

6. The vehicle of claim 1, wherein the controller controls the driving unit to prevent entry into a stop of the ISG system when the first lowest voltage is smaller than a first determination value.

7. The vehicle of claim 1, wherein the controller determines whether the lowest voltage of the battery has been changed when the first lowest voltage is larger than a first determination value.

8. The vehicle of claim 1, wherein the controller controls the driving unit to allow entry into a stop of the ISG system when the second lowest voltage is larger than the second determination value.

9. The vehicle of claim 1, wherein the controller controls the driving unit to prevent entry into a stop of the ISG system when the second lowest voltage is smaller than the second determination value.

10. The vehicle of claim 1, wherein the controller performs moving average processing on the current lowest voltage of the battery to predict the first lowest voltage.

11. A method of controlling a vehicle using an Idle Stop and Go (ISG) system, the method comprising:
    comparing a first lowest voltage predicted using a current lowest voltage of a battery with a reference value to determine whether a lowest voltage of the battery has been changed;
    in response to determining the lowest voltage of the battery has been changed, calculating a difference between the current lowest voltage of the battery and an immediately previous lowest voltage of the battery;
    calculating an accumulated current between a current of the battery at the immediately previous time point and a current of the battery at the current time point;
    calculating a correction voltage for the accumulated current;
    predicting a second lowest voltage using at least one of the difference between the current lowest voltage of the battery and the immediately previous lowest voltage of the battery or the correction voltage; and
    comparing the second lowest voltage with a second determination value and controlling entry into a stop of the ISG system according to a result of the comparison.

12. The method of claim 11, further comprising storing the current lowest voltage of the battery and the immediately previous lowest voltage.

13. The method of claim 11, further comprising determining that the lowest voltage of the battery has been changed when a value of the first lowest voltage minus the current lowest voltage of the battery is larger than the reference value.

14. The method of claim 11, further comprising allowing entry into a stop of the ISG system when a value of the first lowest voltage minus the current lowest voltage is smaller than the reference value.

15. The method of claim 11, further comprising predicting the second lowest voltage using a value of the current lowest voltage of the battery minus the difference between the current lowest voltage and the immediately previous lowest voltage and the correction voltage.

16. The method of claim 11, further comprising preventing entry into a stop of the ISG system when the first lowest voltage is smaller than a first determination value.

17. The method of claim 11, further comprising determining whether the lowest voltage of the battery has been changed when the first lowest voltage is larger than a first determination value.

18. The method of claim 11, further comprising allowing entry into a stop of the ISG system when the second lowest voltage is larger than the second determination value.

19. The method of claim 11, further comprising preventing entry into a stop of the ISG system when the second lowest voltage is smaller than the second determination value.

20. The method of claim 11, further comprising performing moving average processing on the current lowest voltage of the battery to predict the first lowest voltage.

* * * * *